US005689213A

United States Patent [19]

Sher

[11] Patent Number: 5,689,213
[45] Date of Patent: Nov. 18, 1997

[54] POST-FABRICATION PROGRAMMABLE INTEGRATED CIRCUIT RING OSCILLATOR

[75] Inventor: Joseph C. Sher, Boise, Id.

[73] Assignee: Micron Technology, Inc., Boise, Id.

[21] Appl. No.: 518,544

[22] Filed: Aug. 23, 1995

[51] Int. Cl.$^6$ .................... G11C 7/00; H03K 5/13
[52] U.S. Cl. ............ 331/57; 365/222; 365/225.7; 327/276
[58] Field of Search ................ 331/57, 108 C, 331/DIG. 3; 365/225.7, 222, 233; 327/276, 277, 281, 278

[56] References Cited

U.S. PATENT DOCUMENTS

| 4,517,532 | 5/1985 | Neidorff ................ 331/57 |
| 5,233,316 | 8/1993 | Yamada et al. ........ 331/45 |
| 5,410,510 | 4/1995 | Smith et al. .......... 365/201 |
| 5,461,591 | 10/1995 | Kim et al. ........... 331/57 X |

FOREIGN PATENT DOCUMENTS 363286020  11/1988  Japan ................ 327/278

Primary Examiner—Robert Pascal
Assistant Examiner—Arnold Kinkead
Attorney, Agent, or Firm—Seed and Berry LLP

[57] ABSTRACT

A ring oscillator composed of a plurality of series connected inverters, the number of which may be varied after fabrication of the ring oscillator by selectively programming selections between the output of the ring oscillator and the inputs of respective inverters. In the preferred embodiment of the invention, a logic gate receiving an enable signal is connected in series with the inverters to allow the ring oscillator to be selectively enabled. Programmable connections, such as laser fuses, metal fuses, or semiconductor switches, are connected between the output of the ring oscillator and the inputs of at least some of the inverters. The ring oscillator may be advantageously used to drive the voltage pump used in a conventional DRAM integrated circuit. The inventive ring oscillator may also be used to periodically trigger a refresh circuit in a DRAM integrated circuit.

37 Claims, 4 Drawing Sheets

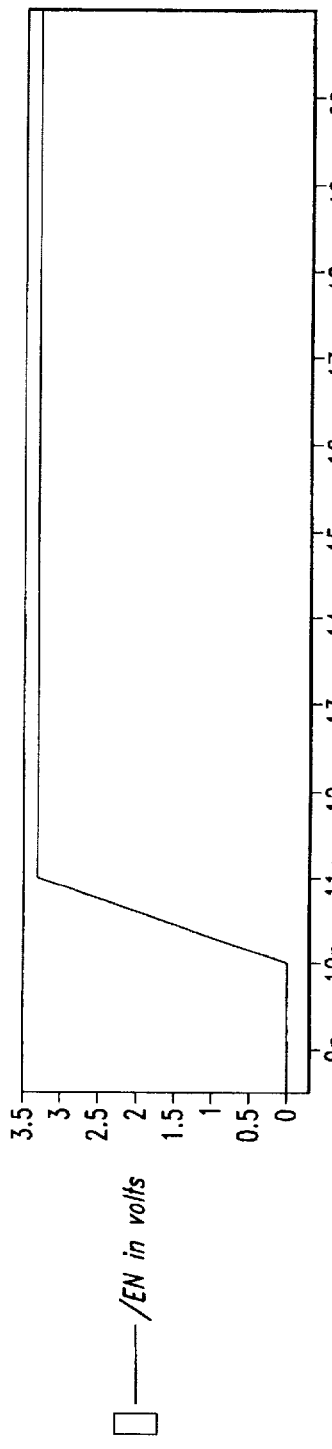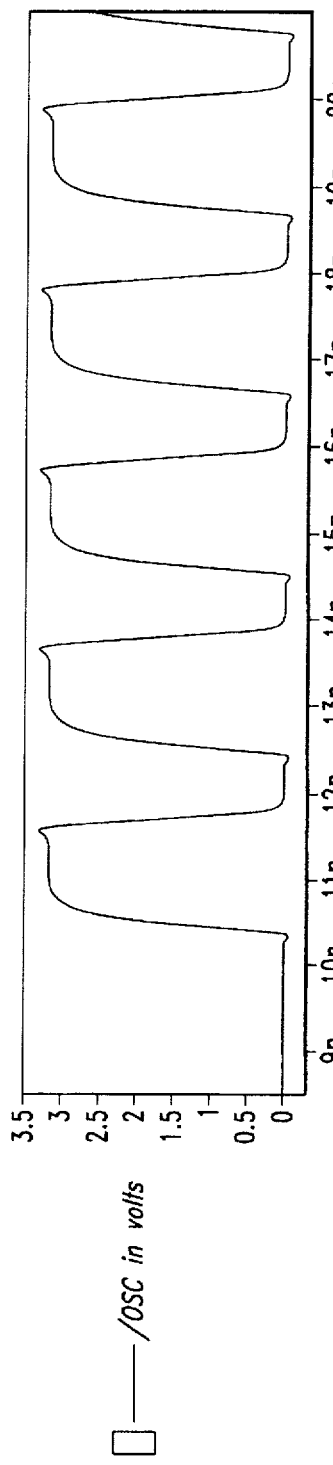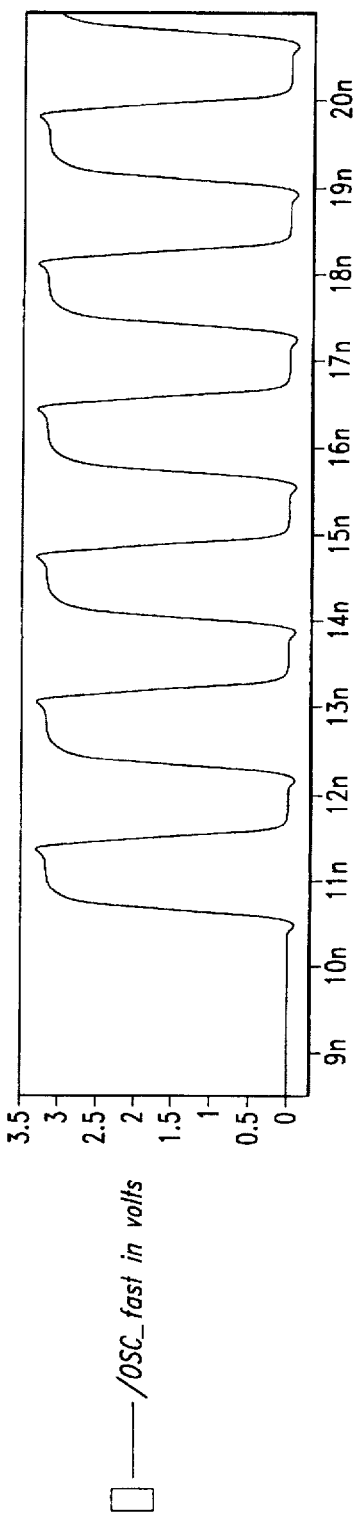

POST-FABRICATION PROGRAMMABLE INTEGRATED CIRCUIT RING OSCILLATOR

TECHNICAL FIELD

This invention relates to integrated circuits, and more particularly to ring oscillators used in integrated circuits, such as dynamic random access memory integrated circuits.

BACKGROUND OF THE INVENTION

Integrated circuits of various types, such as dynamic random access memories ("DRAMs"), often include oscillator circuits used for various purposes. For example, oscillator circuits are used in DRAMs to generate clock signals for internal timing, to generate clock signals used to drive voltage pumps, or to generate periodic trigger signals to refresh DRAMs. One type of oscillator circuit commonly employed in integrated circuits is known as a "ring oscillator." A ring oscillator consists of an odd number of inverting integrated circuits, such as conventional inverters, that are connected in series with each other to form a continuous loop. A conventional ring oscillator 10 is illustrated in FIG. 1 in which the single inverter shown therein represents an odd number of inverters, the variable "N" being a positive integer. It will be apparent to one skilled in the art that a ring consisting of an odd number of inverters is inherently unstable. The ring will therefore oscillate because an output of the oscillator circuit at one logic level, when fed back to the input of the oscillator circuit, causes the output to be at a different logic level. The clock frequency of a ring oscillator is inversely proportional to the amount of time required for a logic transition to propagate from the input to the first inverter to the output of the last inverter. Since a propagation time exists for each inverter, the clock frequency is normally inversely proportional to the number of inverters used in the ring oscillator. The propagation delay of each inverter, and hence the clock frequency of the ring oscillator 10, is a function of such variables as the process technology, manufacturing tolerances, and the supply voltage.

It is generally difficult to accurately predict the clock frequency of an integrated circuit ring oscillator prior to fabrication. For example, an integrated circuit designer may use a ring oscillator consisting of seven inverters connected in series in an attempt to provide a 1 MHz clock signal. However, after the integrated circuit has been fabricated, testing may determine that the clock frequency of the ring oscillator is actually 700 kHz. At this point, the integrated circuit designer might conclude that a ring oscillator consisting of five inverters would produce a clock signal having a frequency of approximately 1 MHz, i.e., (700 kHz*7/5). At this point, the clock frequency of the ring oscillator can be adjusted only by scrapping all of the wafers produced by the original masks and remasking to produce a ring oscillator consisting of only five inverters.

The integrated circuit designer may "hedge" his or her original design by fabricating a large number of inverters on the substrate and designing the metallization mask to interconnect a predetermined number of those inverters in series with each other. If the number of inverters initially selected is found to be incorrect after the fabrication of integrated circuits from the initial mask, the number of inverters can be altered by altering only the metallization mask. However, selecting the correct number of inverters for the ring oscillator in this manner still requires that all wafers generated from the original mask be scrapped and it still requires a remasking step.

Even after the integrated circuit designer has determined through trial and error the correct number of inverters in the ring oscillator, there are still situations in which the number of inverters will be incorrect. For example, as mentioned above, the clock frequency of a ring oscillator will vary with the supply voltage. If a ring oscillator consisting of a specific number of inverters operates at a desired frequency at one voltage, it will not operate at the desired frequency when a substantially different supply voltage is used. Thus, when an integrated circuit designed for use at one supply voltage is used at a different supply voltage, the integrated circuit designer must once again go through a process of trial and error to determine the correct number of inverters that should be used in the ring oscillator at the different supply voltage.

SUMMARY OF THE INVENTION

The inventive method and apparatus includes a ring oscillator formed on an integrated substrate by three or more inverting circuits, such as inverters, connected in series with each other in a continuous loop. A plurality of programmable connections are also fabricated on the integrated circuit substrate. Each of the programmable connections extends from an output of one inverting circuit to the input of a respective other inverting circuit located an even number of inverting circuits away from the output of the inverting circuit. The programmable connections are programmable after fabrication of the integrated circuit to short-circuit a selected programmable connection and open circuit all of the remaining programmable connections. As a result, the number of inverting circuits placed in the loop can be varied after fabrication and test of the integrated circuit. More specifically, after the correct number of inverting circuits for a given application have been determined by trial and error using a relatively few integrated circuits on a wafer, all of the remaining integrated circuits on the wafer and other wafers manufactured from the same mask set can be programmed in the same manner. The programmable connections are preferably laser fuses, but other selectively conductive elements, such as metal fuses, semiconductor switches and the like, may also be used. One of the inverting circuits is preferably formed by a logic gate having an input that is selectively enabled to control the operation of the ring oscillator. The inventive ring oscillator may be used in a DRAM integrated circuit in a variety of manners, such as to drive a voltage pump or to periodically trigger a refresh of the memory cells in the DRAM. When the ring oscillator is used to drive a voltage pump, the enable input of the ring oscillator is preferably controlled by a voltage regulator which enables the ring oscillator when the voltage generated by the voltage pump varies from a target value by a predetermined magnitude.

BRIEF DESCRIPTION OF THE DRAWINGS

FIGS. 4A–C are waveform diagrams showing a clock signal generated by the ring oscillator of FIG. 3 in response to an enable signal programmed with different numbers of inverters in the ring.

DETAILED DESCRIPTION OF THE INVENTION

Figure 1:
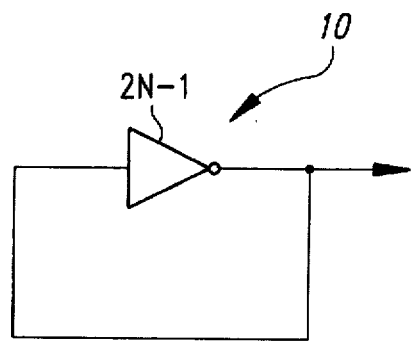
FIG. 1 is a generalized schematic of a prior art ring oscillator.
Figure 2:
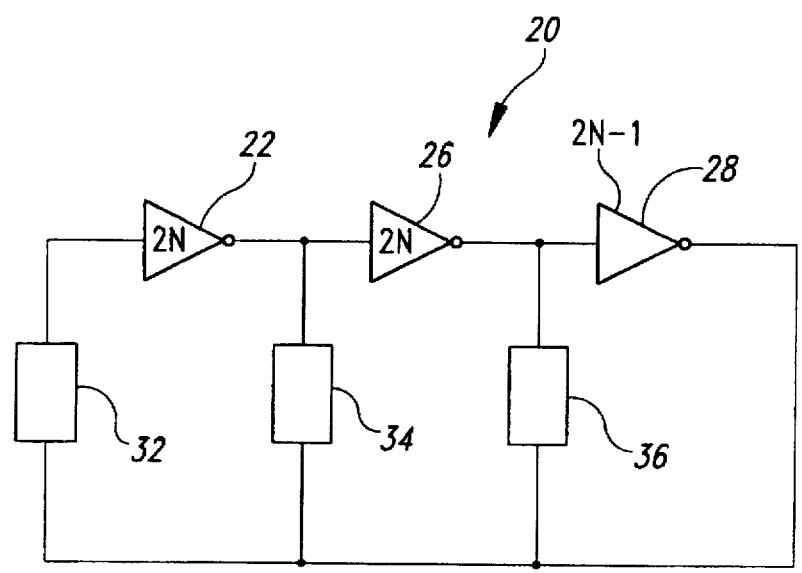
FIG. 2 is a generalized schematic of one embodiment of the inventive ring oscillator.

One embodiment of the inventive ring oscillator 20, as illustrated in FIG. 2, includes three serially connected groups of inverters 22, 26, 28, the last one of which 28 consists of an odd number of inverters (i.e., 2N−1 where N is a positive integer) and the remainder of which 22, 26 consists of an even number of inverters (i.e., 2N). The output of the odd inverters group 28 is connected to a plurality of programmable connections 32–36, each of which is connected to the input of a respective even inverter group 22, 26. As a result, there are always an odd number of inverters in a loop containing the odd inverter group 28 and either or both of the even inverter groups 22, 26.

After the ring oscillator 20 shown in FIG. 2 has been fabricated on a semiconductor substrate, it is programmed to select the number of inverter groups 22–28 that will be used in the ring oscillator 20. The highest clock frequency is selected by programming the programmable connections 32, 34 to an open circuited condition and programming the programmable connector 36 to a short circuited condition. Under these circumstances, the ring oscillator will consist of only the odd inverter group 28 (which may consist of a single inverter) and the period of the clock will be twice the propagation delay of the inverter group 28. An intermediate clock frequency can be programmed by open circuiting the programmable connectors 32, 36 and short-circuiting the programmable connector 34, thereby placing the odd inverter group 28 and one even inverter group 26 in the ring oscillator. Finally, the lowest frequency can be programmed by open circuiting the programmable connections 34, 36 and short-circuiting the programmable connection 32, thereby placing all of the inverter groups 22–28 in the ring oscillator.

As mentioned above, the number of inverters used in each group 22–28 can vary as long as an odd number (2N−1) of inverters are used in the inverter group 28 and an even number (2N) of inverters are used in the remaining groups 22, 26. Also, the number of inverter groups and/or programmable connections can vary as desired. Finally, although conventional inverters may be used to implement inverting circuits in the groups 22–28, other types of inverting circuits, such as NAND or NOR gates, may also be used.

Figure 3:
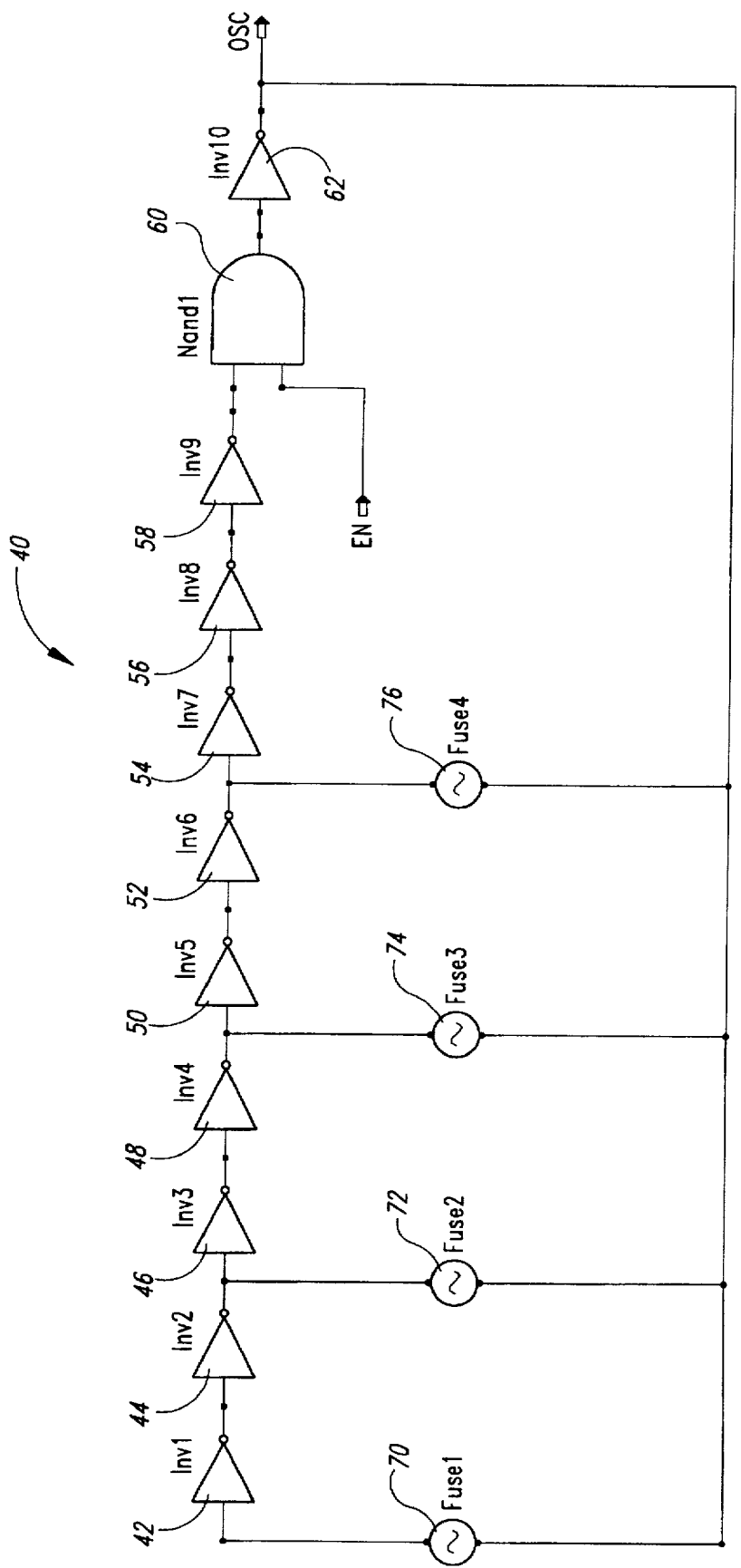
FIG. 3 is a schematic of a preferred embodiment of the inventive ring oscillator.

A preferred embodiment of the inventive programmable ring oscillator is illustrated in FIG. 3. The ring oscillator 40 of FIG. 3 utilizes nine serially connected inverters 42–58, the last of which inverter, 58, is connected to one input of a NAND gate 60. The output of the NAND gate 60 is applied to a tenth inverter 62, the output of which is used as the output of the ring oscillator 40. The other input of the NAND gate 60 receives an enable signal for controlling the operation of the ring oscillator 40, as explained below. The output of the inverter 62 is connected to four laser fuses 70–76 which are connected to the inputs of respective inverters 42, 46, 50 and 54. Although the ring oscillator 40 shown in FIG. 3 uses 11 inverting circuits, it will be understood that any number of inverting circuits equal to 2N−1 (where N is a positive integer greater than 1) may be used.

In operation, after the ring oscillator 40 shown in FIG. 3 has been fabricated on a semiconductor substrate, it is programmed to place a desired number of inverting circuits in the ring oscillator 40. All but one of the laser fuses 70–76 are programmed to an open circuited condition so that the output of the inverter 62 will be connected to the input of another inverter 42, 46, 48, 54 located an odd number of inverting circuits away from the output of the inverter 62. Depending upon the laser fuse 70–76 selected to remain in its short circuited condition, there will be 2M−1 inverting circuits in the ring oscillator where M is an integer between 1 and N. The highest clock frequency is obtained by open circuiting the fuses 70, 72, 74 by applying laser radiation to the fuses 70–74 and leaving the laser fuse 76 intact in its short-circuited condition. As a result, the ring oscillator 40 consists of five inverting circuits, i.e., four inverters 54, 56, 58 and 62 and a NAND gate 60. When a logic low is applied to the enable input of the NAND gate 60, the output of the NAND gate 60 is held high, thereby causing the output of the inverter 62 to be held low. Under these circumstances, the ring oscillator 40 is disabled. When the enable input to the NAND gate 60 is logic high, the NAND gate 60 is enabled, thereby causing the NAND gate 60 to function as an inverter. Since an odd number of inverting circuits, i.e. , inverters 54–58, 62 and NAND gate 60, are connected in a loop, the oscillator circuit 40 will then begin to oscillate.

A lower clock frequency can be obtained by programming the laser fuses 70, 72 and 76 to an open circuited condition and leaving the laser fuse 74 intact, thereby placing in a loop seven inverting circuits, i.e., inverters 50–58, 62 and NAND gate 60. A still lower clock frequency can be obtained by programming the laser fuses 70, 74 and 76 to an open circuited condition and leaving the laser fuse 72 intact, thereby placing in a loop nine inverting circuits, i.e., inverters 46–58, 60 and NAND gate 60. Finally, the lowest frequency can be programmed by programming the laser fuses 72–76 to an open circuited condition and leaving the laser fuse 70 intact, thereby placing in a loop eleven inverting circuits, i.e., inverters 42–58, 62 and NAND gate 60.

The clock signal generated by the ring oscillator 40 of FIG. 3 in response to an enable signal is illustrated in FIGS. 4A–4C. As shown in FIG. 4A, the enable signal transitions from a logic low voltage level to a logic high voltage level starting at approximately ten nanoseconds. Prior to being enabled by this transition, the output of the ring oscillator 40 is held low, as shown in FIG. 4B. However, when enabled by the low to high transition of the enable signal, a clock signal is generated at the output of the inverter 62 as shown in FIG. 4B. FIG. 4B shows the clock signal generated with the ring oscillator 40 programmed at its lowest frequency with the laser fuses 72–76 programmed to their open circuit condition and laser fuse 70 left intact in its short-circuited condition. FIG. 4C shows the output of the ring oscillator 40 programmed to the next higher frequency with the laser fuses 70, 74 and 76 programmed to their open circuit condition and the laser fuse 72 left intact in its short-circuited condition. As shown in FIGS. 4B and 4C, by removing the inverters 42, 44 from the ring, the clock frequency of the ring oscillator 40 increases by about 17% from the lowest clock frequency.

Figure 5:
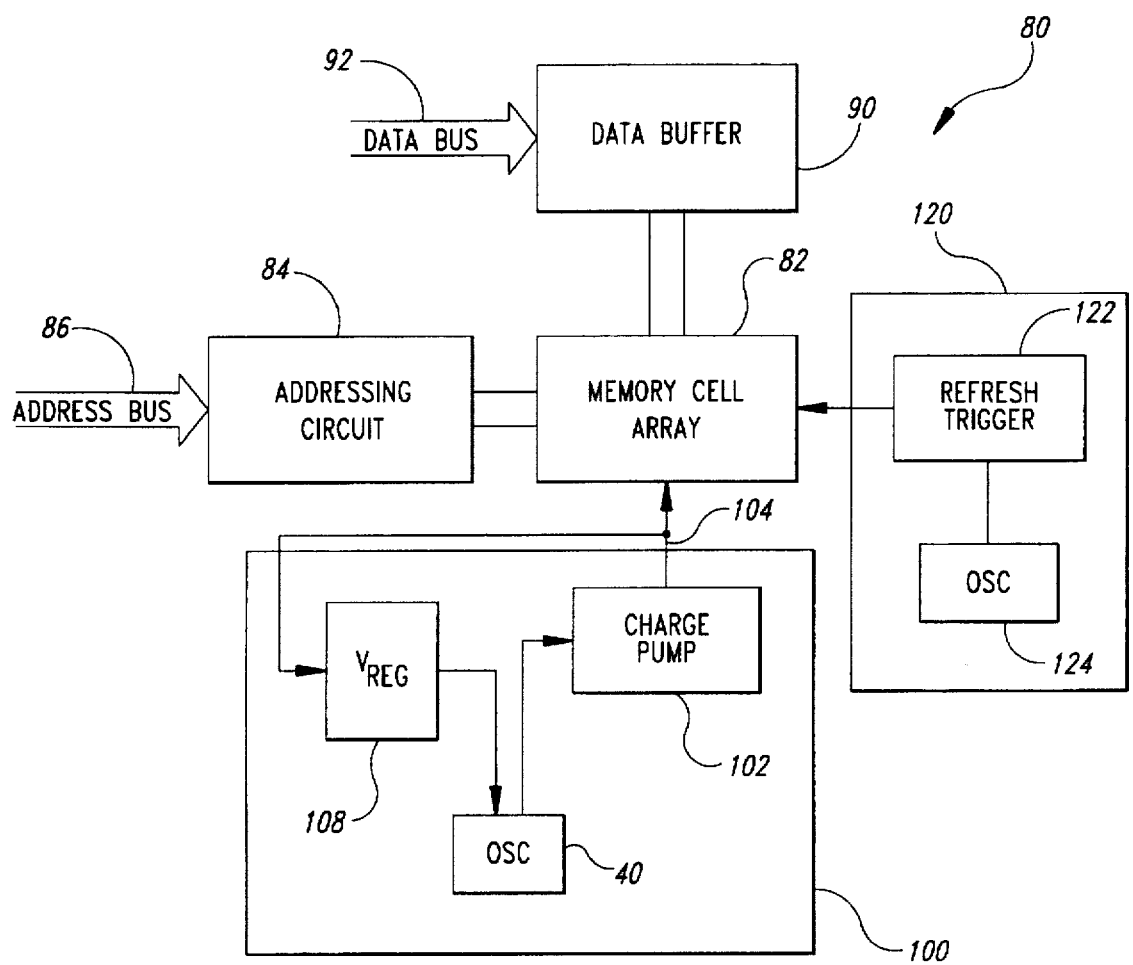
FIG. 5 is a block diagram of the inventive ring oscillator used for various purposes in a typical DRAM integrated circuit.

The inventive ring oscillator may be used in a conventional DRAM circuit which is illustrated in very general form in FIG. 5. The DRAM circuit includes a memory cell array 82 containing a large number of memory cells each of which stores one bit of information. A particular cell or group of cells in the array is selected by an addressing circuit 84 (which may include buffers and decoders) as a function of an address received on an address bus 86. Data routed through a data buffer circuit 90 to or from a data bus 92 is then either written into or read from the memory cell array 82. It is conventional for such DRAM circuits 80 to include a charge pump system including a charge pump 102 generating an output voltage on line 104. The voltage generated on line 104 is used for a variety of purposes, including as a supply voltage to the DRAM circuit and as a bias voltage for the substrate of the DRAM circuit.

In operation, the voltage on line 104 is driven toward a target voltage in response to a clock signal from the oscillator 40 when the oscillator 40 is enabled by an enable signal from a voltage regulator 108. The voltage regulator 108 compares the voltage on line 104 to a target voltage and generates the enable signal whenever the voltage on line 104 differs from the target voltage by a determinable magnitude. The oscillator 40 then generates pulses that are applied to the charge pump 102 to cause the charge pump 102 to increase the voltage on line 104 toward the target voltage. When the target voltage is reached, the voltage regulator 108 discontinues the enabled signal, thereby causing the oscillator to discontinue applying pulses to the charge pump 102. The inventive ring oscillator 40 may be advantageously employed in the charge pump system 100 because its operating frequency can be adjusted after the fabrication of the integrated circuit.

Another use of the inventive ring oscillator is in a refresh circuit for a DRAM. The memory cell array 82 of a conventional DRAM circuit 80 must be periodically refreshed so that data stored in the array 82 is not lost as capacitors used to store the data discharge. Refreshing is normally accomplished by a refresh system 120 including a conventional refresh circuit 122 (which may include refresh controllers and counters) that is periodically triggered by an oscillator 124. The inventive ring oscillator can advantageously be used as the oscillator 124 because it allows the refresh rate of the DRAM 80 to be adjusted after fabrication of the DRAM circuit 80. Adjustment might be required because of the unpredictability of determining the optimum refresh rate prior to fabrication and because of variations in the operating voltage. Other uses of the inventive ring oscillator in DRAM circuits and other integrated circuits will be apparent to one skilled in the art.

Figure 6:
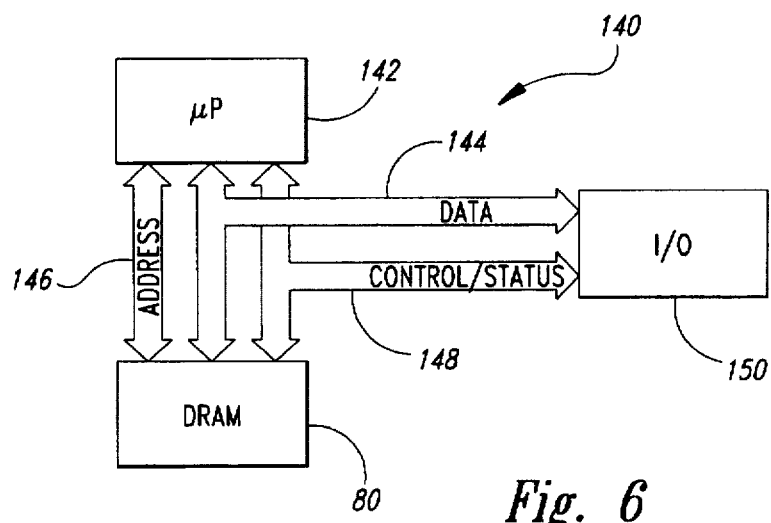
FIG. 6 is a block diagram showing the DRAM circuit of FIG. 5 used in a conventional computer system.

The DRAM circuit 80 illustrated in FIG. 5 can be used in a conventional computer system shown in FIG. 6. The computer system 140 includes a conventional microprocessor 142 having a data bus 144, an address bus 146, and a control and status bus 148. The DRAM 80 is connected to each of these buses 144–148 to allow the microprocessor 142 to write data into the DRAM 80 and read data from the DRAM 80. An input/output device 150, such as a keyboard, display, or other device, is connected to the microprocessor 142 to provide a means for the flow of data to and from the microprocessor 142.

While various embodiments have been described in this application for illustrative purposes, the claims are not so limited. Rather, any equivalent method or device operating according to principles of the invention falls within the scope thereof.

I claim:

1. A programmable ring oscillator fabricated on a substrate of a DRAM integrated circuit for use in a charge pump or refresh circuit, comprising:

2N−1 inverting circuits fabricated on said integrated circuit substrate, N being an integer equal to or greater than 2, said inverting circuits being connected in series with each other; and a plurality of programmable connections fabricated on said integrated circuit substrate, said programmable connections extending from an output of one of said inverting circuits to an input of a respective other of said inverting circuits located an odd number of inverting circuits away from the output of said one inverting circuit, said programmable connections being programmable after fabrication of said integrated circuit to short circuit a selected programmable connection and open circuit all but said selected programmable connection thereby placing 2M−1 of said inverting circuits in a loop after fabrication of said integrated circuit, M being an integer between 1 and N, whereby the oscillation frequency may be programmed after fabrication of the integrated circuit.

2. The programmable ring oscillator integrated circuit of claim 1 wherein at least some of said inverting circuits are conventional MOSFET inverter circuits.

3. The programmable ring oscillator integrated circuit of claim 1 wherein at least some of said inverting circuits are conventional MOSFET inverter circuits, and wherein one of said inverting circuits includes a logic gate having at least two inputs and an output, one of said inputs being connected to the output of another inverting circuit, the other of said inputs being used as an enable input to said ring oscillator to selectively operate said ring oscillator, and said output being connected to the input of another of said inverting circuits.

4. The programmable ring oscillator integrated circuit of claim 3 wherein said logic gate inverts the logic level of a signal applied to said one input of said logic gate.

5. The programmable ring oscillator integrated circuit of claim 1 wherein one of said inverting circuits includes a logic gate having at least two inputs and an output, one of said inputs being connected to the output of another inverting circuit, the other of said inputs being used as an enable input to said ring oscillator to selectively operate said ring oscillator, and said output being connected to the input of another of said inverting circuits.

6. The programmable ring oscillator integrated circuit of claim 5 wherein said logic gate inverts the logic level of a signal applied to said one input of said logic gate.

7. The programmable ring oscillator integrated circuit of claim 1 wherein at least some of said programmable connections are laser fuses.

8. The programmable ring oscillator integrated circuit of claim 1 wherein at least some of said programmable connections are electrically opened metal fuses.

9. The programmable ring oscillator integrated circuit of claim 1 wherein at least some of said programmable connections are semiconductor switches that are programmed to be opened or closed with a respective control signal.

10. A DRAM integrated circuit comprising:

a memory cell array adapted to store binary information;

an addressing circuit operatively connected to said memory cell array for selectively providing access to memory cells in said memory said array for writing data into and reading data from said memory cell array;

a data buffer circuit operatively connected to said memory cell array for routing data to and from said memory cell array for respectively writing data into and reading data from said memory cell array;

a charge pump operatively connected to said memory cell array for providing a voltage for use by said memory cell array, said charge pump altering the magnitude of said voltage toward a target voltage in response to a clock signal; and a programmable ring oscillator generating said clock signal, said oscillator including 2N−1 inverting circuits where N is an integer equal to or greater than 2, said inverting circuits being connected in series with each other with said clock signal being generated at an output of one of said inverting circuits, said oscillator further including a plurality of programmable connections extending from an output of one of said inverting circuits to an input of a respective other of said inverting circuits located an odd number of inverting circuits away from the output of said one inverting circuit, said programmable connections being programmable after fabrication of said integrated circuit to short circuit a selected programmable connection and open circuit all but said selected programmable connection thereby placing 2M−1 of said inverting circuits in a loop where M is an integer between 1 and N, whereby the frequency of said clock signal may be adjusted after fabrication of said integrated circuit by programming said programmable connections.

11. The DRAM integrated circuit of claim 10 wherein the voltage generated by said charge pump is used as a supply voltage for said DRAM integrated circuit.

12. The DRAM integrated circuit of claim 10 wherein the voltage generated by said charge pump is used as a substrate bias voltage that is applied to a substrate of said DRAM integrated circuit.

13. The DRAM integrated circuit of claim 10 wherein said charge pump includes a voltage regulator providing an actuation signal when said voltage deviates from said target voltage by a definitive magnitude, and wherein one of said inverting circuits includes a logic gate having at least two inputs and an output, one of said inputs being connected to the output of another inverting circuit, the other of said inputs being used as an enable input to said ring oscillator to selectively operate said ring oscillator, said output being connected to the input of another of said inverting circuits, the enable input of said logic gate receiving said actuation signal to selectively actuate said ring oscillator when said voltage deviates from said target voltage by said definitive magnitude thereby causing said charge pump to alter the magnitude of said voltage toward said target voltage.

14. The DRAM integrated circuit of claim 10 wherein at least some of said programmable connections are laser fuses.

15. The DRAM integrated circuit of claim 10 wherein at least some of said programmable connections are electrically opened metal fuses.

16. The DRAM integrated circuit of claim 10 wherein at least some of said programmable connections are semiconductor switches that are programmed to be opened or closed with a respective control signal.

17. A DRAM integrated circuit comprising:
a memory cell array adapted to store binary information;
an addressing circuit operatively connected to said memory cell array for selectively providing access to memory cells in said memory cell array for writing data into and reading data from said memory cell array;
a data buffer circuit operatively connected to said memory cell array for routing data to and from said memory cell array for respectively writing data into and reading data from said memory cell array;
a refresh circuit refreshing data stored in at least part of said memory cell array responsive to a refresh signal; and
a programmable ring oscillator periodically generating said refresh signal, said oscillator including 2N−1 inverting circuits where N is an integer equal to or greater than 2, said inverting circuits being connected in series with each other with said refresh signal being generated at an output of one of said inverting circuits, said oscillator further including a plurality of programmable connections extending from an output of one of said inverting circuits to an input of a respective other of said inverting circuits located an odd number of inverting circuits away from the output of said one inverting circuit, said programmable connections being programmable after fabrication of said integrated circuit to short circuit a selected programmable connection and open circuit all but said selected programmable connection thereby placing 2M−1 of said inverting circuits in a loop where M is an integer between 1 and N, whereby the frequency of said refresh signal may be adjusted after fabrication of said integrated circuit by programming said programmable connections.

18. The DRAM integrated circuit of claim 17 wherein at least some of said programmable connections are laser fuses.

19. The DRAM integrated circuit of claim 17 wherein at least some of said programmable connections are electrically opened metal fuses.

20. The DRAM integrated circuit of claim 17 wherein at least some of said programmable connections are semiconductor switches that are programmed to be opened or closed with a respective control signal.

21. A computer system, comprising:
a data processor circuit having an address bus, a data bus, and a control bus;
an input/output device operatively connected to said data processor circuit for allowing data to be input to or output from said computer system; and
a DRAM integrated circuit having an address bus connected to the address bus of said data processor circuit, a data bus connected to the data bus of said data processor circuit, and control lines connected at least a portion of the control bus of said data processor circuit, said DRAM integrated circuit comprising:
a memory cell array adapted to store binary information;
an addressing circuit operatively connected to the address bus of said DRAM integrated circuit and to said memory cell array for selectively providing access to memory cells in said memory cell array for writing data into and reading data from said memory cell array;
a data buffer circuit operatively connected to the data bus of said DRAM integrated circuit and to said memory cell array for routing data to and from said memory cell array for respectively writing data into and reading data from said memory cell array; and
a programmable ring oscillator generating an oscillator signal for use by said DRAM integrated circuit, said oscillator including 2N−1 inverting circuits where N is an integer equal to or greater than 2, said inverting circuits being connected in series with each other with said clock signal being generated at an output of one of said inverting circuits, said oscillator further including a plurality of programmable connections extending from an output of one of said inverting circuits to an input of a respective other of said inverting circuits located an odd number of inverting circuits away from the output of said one inverting circuit, said programmable connections being programmable after fabrication of said integrated circuit to short circuit a selected programmable connection and open circuit all but said selected programmable connection thereby placing 2M−1 of said inverting circuits in a loop where M is an integer between 1 and N, whereby the frequency of said oscillator signal may be adjusted after fabrication of said integrated circuit by programming said programmable connections.

22. The computer system of claim 21 wherein said DRAM circuit further includes a charge pump operatively connected to said memory cell array for providing a voltage for use by said memory cell array, said charge pump altering the magnitude of said voltage toward a target voltage in response to a clock signal, and wherein an oscillator signal generated by said oscillator is used as said clock signal whereby the frequency of said clock signal may be adjusted after fabrication of said integrated circuit by programming said programmable connections.

23. The computer system of claim 22 wherein the voltage generated by said charge pump is used as a supply voltage for said DRAM integrated circuit.

24. The computer system of claim 22 wherein the voltage generated by said charge pump is used as a substrate bias voltage that is applied to a substrate of said DRAM integrated circuit.

25. The computer system of claim 22 wherein said charge pump includes a voltage regulator providing an actuation signal when said voltage deviates from said target voltage by a definitive magnitude, and wherein one of said inverting circuits includes a logic gate having at least two inputs and an output, one of said inputs being connected to the output of another inverting circuit, the other of said inputs being used as an enable input to said ring oscillator to selectively operate said ring oscillator, and said output being connected to the input of another of said inverting circuits, the enable input of said logic gate receiving said actuation signal to selectively actuate said ring oscillator when said voltage deviates from said target voltage by said definitive magnitude thereby causing said charge pump to alter the magnitude of said voltage toward said target voltage.

26. The computer system of claim 21 wherein said DRAM circuit further includes a refresh circuit refreshing data stored in at least part of said memory cell array responsive to a refresh signal, and wherein the oscillator signal generated by said oscillator is used as said refresh signal whereby the refresh rate of said DRAM integrated circuit may be adjusted after fabrication of said DRAM integrated circuit by programming said programmable connections.

27. The computer system of claim 21 wherein at least some of said programmable connections are laser fuses.

28. The computer system of claim 21 wherein at least some of said programmable connections are electrically opened metal fuses.

29. The computer system of claim 21 wherein at least some of said programmable connections are semiconductor switches that are programmed to be opened or closed with a respective control signal.

30. A method of programming the operating frequency of a ring oscillator fabricated on a substrate of a DRAM integrated circuit for use in a charge pump or refresh circuit, said ring oscillator including 2N−1 inverting circuits fabricated on said integrated circuit substrate, N being an integer equal to or greater than 2, said inverting circuits being connected in series with each other, said method comprising:

fabricating a plurality of programmable connections on said integrated circuit substrate, said programmable connections extending from an output of one of said inverting circuits to an input of a respective other of said inverting circuits located an odd number of inverting circuits away from the output of said one inverting circuit; and programming said programmable connections after fabrication of said integrated circuit to short circuit a selected programmable connection and open circuit all but said selected programmable connection thereby placing 2M−1 of said inverting circuits in a loop after fabrication of said integrated circuit, M being an integer between 1 and N.

31. The method of claim 30 wherein said programmable connections comprise normally short circuited laser fuses, and wherein said step of programming said programmable connections includes the step of selectively applying laser radiation to all but one of said laser fuses after fabrication of said integrated circuit thereby open circuiting all but said one laser fuse.

32. The method of claim 30 wherein said programmable connections comprise normally short circuited metal fuses, and wherein said step of programming said programmable connections includes the step of selectively applying an electrical signal to all but one of said metal fuses after fabrication of said integrated circuit thereby open circuiting all but said one metal fuses.

33. The method of claim 30 wherein said programmable connections comprise semiconductor switches, and wherein said step of programming said programmable connections includes the step of applying a respective control signal to each of said semiconductor switches after fabrication of said integrated circuit to close one of said semiconductor switches and open all but said one semiconductor switch.

34. A method of controlling the frequency of a ring oscillator fabricated on a substrate of a DRAM integrated circuit for use in a charge pump or refresh circuit, said ring oscillator including 2N−1 inverting circuits fabricated on said integrated circuit substrate, N being an integer greater than 2, said inverting circuits being connected in series with each to form a chain of inverters extending from a first inverter to a last inverter, the last inverter having an output, said method comprising:

providing a plurality of coupling devices between the output of said last inverter and inputs to a plurality of respective inverters located an even number of inverters upstream from the last inverter; and selectively enabling only one coupling device at a time after fabrication of the integrated circuit.

35. The method of claim 34 wherein said coupling devices comprise normally short circuited laser fuses.

36. The method of claim 34 wherein said coupling devices comprise normally short circuited metal fuses.

37. The method of claim 34 wherein said coupling devices comprise semiconductor switches.

\* \* \* \* \*